United States Patent [19]

Hsieh

[11] Patent Number: 4,830,980
[45] Date of Patent: May 16, 1989

[54] MAKING COMPLEMENTARY INTEGRATED P-MODFET AND N-MODFET

[75] Inventor: Kuan H. Hsieh, Los Angeles, Calif.

[73] Assignee: Hughes Aircraft Company, Los Angeles, Calif.

[21] Appl. No.: 184,845

[22] Filed: Apr. 22, 1988

[51] Int. Cl.[4] .............................. H01L 21/18
[52] U.S. Cl. ............................ 437/56; 437/40;
    437/57; 437/58; 357/16; 357/40; 357/22
[58] Field of Search .............. 437/40, 57, 58, 126,
    437/133; 357/16, 22 A, 40

[56] References Cited

U.S. PATENT DOCUMENTS

| | | | |
|---|---|---|---|
| 4,603,469 | 8/1986 | Armiento et al. | 437/40 |
| 4,641,161 | 2/1987 | Kim et al. | 357/23.2 |
| 4,652,896 | 3/1987 | Das et al. | 357/22 A |
| 4,662,058 | 5/1987 | Cirillo, Jr. et al. | 437/40 |
| 4,710,478 | 12/1987 | Yoder et al. | 437/57 |

Primary Examiner—Brian E. Hearn
Assistant Examiner—Tuan Nguyen
Attorney, Agent, or Firm—Wanda K. Denson-Low; A. W. Karambelas; V. G. Laslo

[57] ABSTRACT

An integrated circuit device consisting of an n-channel selectively doped heterojunction transistor (SDHT) and a p-channel SDHT, in the form of complementary MODFETs fabricated on the same wafer, is disclosed. A method for easily fabricating the complementary p- and n-MODFETs on the same wafer is also disclosed whereby a portion of a partially formed n-channel SDHT is implanted with p-type ions of sufficient dosage to transform the portion into a p-channel SDHT. The device is completed by etching an isolation gap between the n-channel and p-channel region, preferably no more than ten microns wide, and adding ohmic source and drain contacts as well as Schottky gate contacts. Many such MODFET pairs may be fabricated on a single wafer.

6 Claims, 3 Drawing Sheets

FIG.3.A.
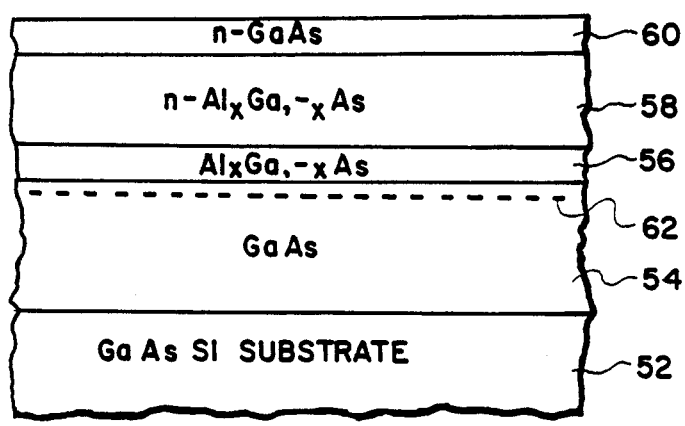
FIG.3.B.
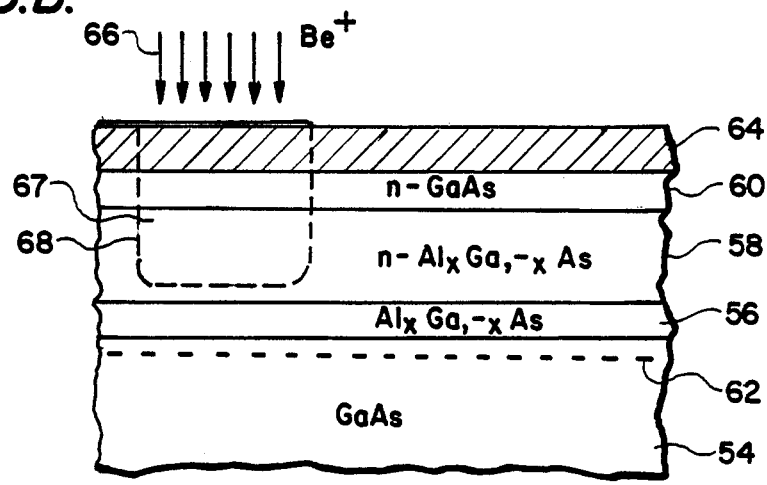
FIG.3.C.
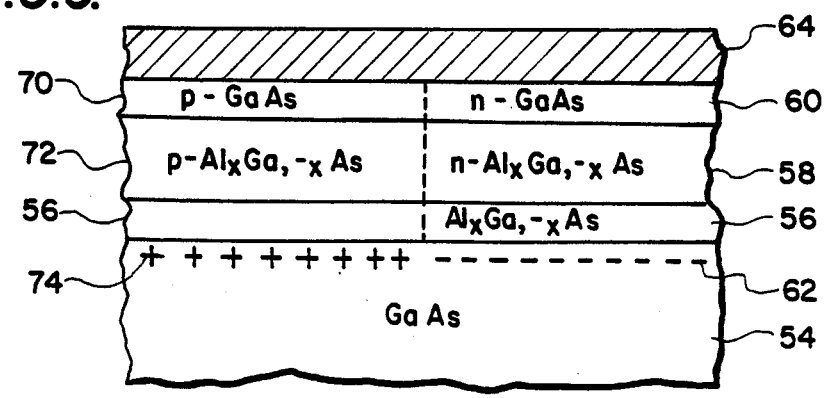

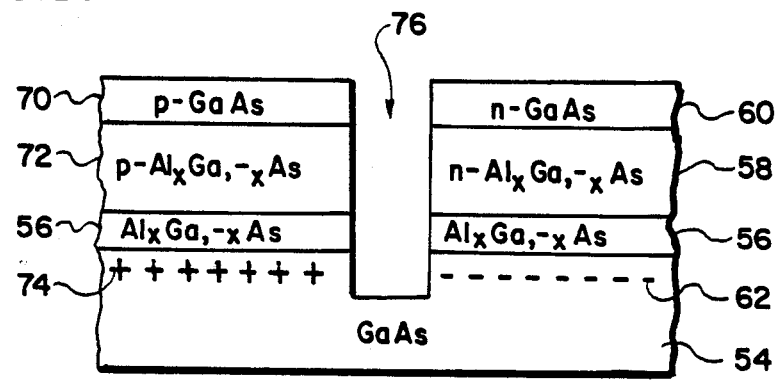
FIG.3.D.
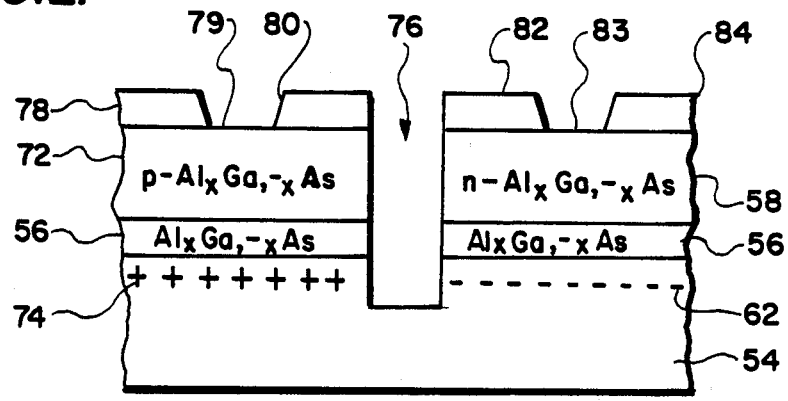
FIG.3.E.
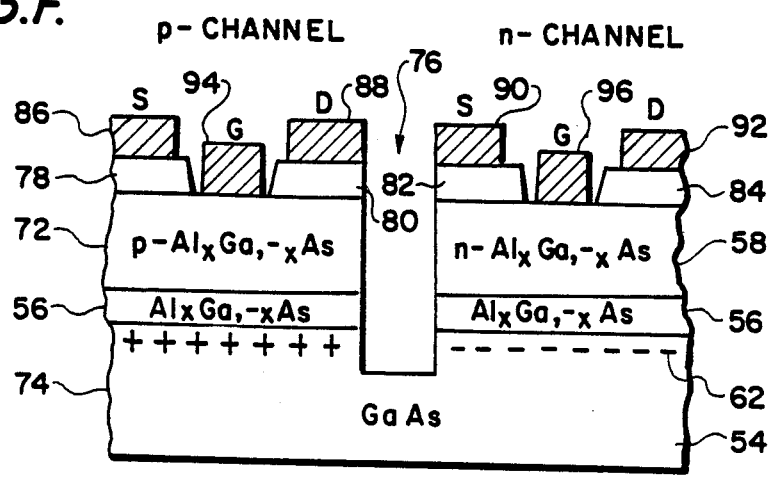
FIG.3.F.

MAKING COMPLEMENTARY INTEGRATED P-MODFET AND N-MODFET

BACKGROUND OF THE INVENTION

1. Field of the Invention

This invention relates to the fabrication of integration circuit wafers, and more particularly to an apparatus and method for fabricating p-channel and n-channel selectively doped heterostructure transistors on the same wafer.

2. Description of the Related Art

Large scale integration (LSI) and very large scale integration (VLSI) memory logic technology typically requires a complementary integrated circuit (IC) which combines intrinsic high switching speed, large noise margins and very low stand-by power dissipation. An answer to this requirement has been the development of the selectively doped heterostructure transistor (SDHT), also known as the high electron mobility transistor (HEMT) or the modulation doped field effect transistor (MODFET). The SDHT is considered to be the fastest switching semiconductor device presently known. It obtains its speed from the presence of a heterojunction, usually between GaAs and $Al_xGa_{1-x}As$. Furthermore, GaAs has a much higher electron mobility than does Si, making GaAs FETs high interest candidates for high-speed integrated circuits.

An important aspect of SDHTs is that the carrier is a quasi two-dimensional electron gas (2DEG). The electron gas is considered quasi two-dimensional because its depth is quite small compared to its width and length. A 2DEG is produced and confined to the side of the heterojunction interface containing the smaller bandgap material; in a $GaAs-Al_xGa_{1-x}As$ junction, the 2DEG is confined to the GaAs interface. Therefore, the GaAs layer in a MODFET is equivalent to the Si substrate of a MOSFET and the $Al_xGa_{1-x}As$ layer is comparable to the $SiO_2$ layer.

While n-channel GaAs FETs have had impressive speed performance, complementary GaAs circuits employing both p-channel and n-channel transistors, particularly complementary p- and n-MODFETs, are much preferable in terms of power dissipation, noise margin and overall circuit integration level.

Numerous unsuccessful attempts have been made to obtain complementary n- and p-MODFETs on the same wafer. Because of the difficulty in achieving such a device, resort has been had to complementary p- and n-channel devices built which mimic a complementary MODFET pair, with varying results. In one such complementary transistor arrangement, a device employed a complementary p-MODFET and an n-channel heterostructure barrier MESFET, not a SDHT, on the same wafer using selective etching. See R. A. Kiehl and A. C. Gossard, "Complementary p-MODFET and n-HB MESFET (Al,Ga)As Transistors," *IEEE Electron Device Letters,* Volume EDL-5, No. 12, December 1984.

FIG. 1 depicts this n-channel HB-MESFET and p-MODFET device. The transistors shown were fabricated on a molecular beam epitaxially grown wafer consisting of the following successive layers for the p-channel MESFET; a Cr-doped GaAs substrate 2, an undoped intrinsic GaAs layer 4, and a Be-doped p-AlGaAs layer 6; for the n-channel HB-MESFET; a Cr-doped GaAs substrate 2, an undoped intrinsic GaAs layer 4, a Be-doped p-AlGaAs layer 6, and a Si-doped n-GaAs layer 8. A window 10 was etched into the intrinsic GaAs layer 4 in regions where the p-MODFETs were to be fabricated, thereby defining the mesas for the two transistors. An AuBe-based p-type metallization was deposited as a drain ohmic contact 12 and a source ohmic contact 14 on p-AlGaAs layer 6 of the p-channel MODFET. This was followed by the deposition of an AuGe-based n-type metallization as drain ohmic contact 16 and source ohmic contact 18 onto the Si-doped n-GaAs layer 8 of the n-channel HB-MESFET. Next, gate contacts 20,22 were deposited on areas which were chemically recessed into n-GaAs layer 8 and p-AlGaAs layer 6, respectively. These gates were typically formed by Ti/Au metallization.

This arrangement yields a complex and undesirable non-planar wafer surface. Not only is the fabrication of such a device quite complex and difficult, with most of its layers alternating between transistors as the device is being fabricated, but the MESFET has a much slower electron mobility. In a MESFET, the carriers must travel in the doped channel and encounter large scale scattering, resulting in slower velocities and slower switching responses than in a MODFET. In a MODFET, the carriers (2DEG) travel in the intrinsic small band material of the heterojunction. Since there are virtually no impurities to scatter the carriers, MODFETs have significantly better response and switching times, brought about by the increased carrier mobility. Therefore, a p-channel MODFET integrated with an n-channel MODFET would be highly desirable.

In another prior complementary transistor device, complementary HIGFETs were employed in an attempt to yield results comparable to the desired complementary p-MODFET and n-MODFET integrated device. See, W. C. Cirillo, Jr., et al., "Complementary Heterostructure Insulated Gate Field Effect Transistors (HIGFETs)", IEEE publication IEDM 85, pages 317–320. HIGFETs are also known as metal-insulator-semiconductor heterostructure FETs or MISFETs. As shown in FIG. 2, the device employed two HIGFETs which were epitaxially grown on the same semi-insulating GaAs substrate 24. Onto this substrate was grown an undoped GaAs buffer layer 25 with an undoped AlGaAs insulating layer 26. WSi Schottky gates 28 and 30 were deposited onto the n-channel and p-channel HIGFETs, respectively. The source and drain regions of both the n- and p-channel HIGFETs were then formed by ion implantation of Si and Mg, respectively. The n+ implanted regions 32, 34 and the p+ implanted regions 36, 38 were activated by annealing. Ohmic source contact 40 and ohmic drain contact 42 were deposited onto the n+ implanted regions 32, 34, respectively, by an AuGeNi-based metallization. Similarly, ohmic source contact 44 and ohmic drain contact 46 were deposited onto the p+ implanted regions 36, 38, respectively, by an AuZn-based metallization. 2DEG 48 was formed between AlGaAs insulating layer 26 and GaAs buffer layer 25, extending between n+ implant regions 32 and 34. Likewise, 2DHG 50 was formed between insulating layer 26 and buffer layer 25, extending instead between p+ implant regions 36 and 38. N- and p-HIGFET isolation was achieved using a selective implant, such as oxygen, to introduce traps and increase resistance between transistors.

Although fabrication of the FIG. 2 HIGFETs is much easier than the FIG. 1 structure, HIGFETs have several limiting characteristics. First, the threshold control is not adjustable; the threshold of both n- and p- channel devices voltage is fixed to an undesirable value. The threshold voltage, $V_t$, is determined by the Schottky barrier height of the heterostructure as well as the band offsets in the conduction and valence bands. For example, the typical refractory metal (e.g. tungsten) gate HIGFET has a threshold voltage of +0.8 volts, too high for typical integrated circuits because 0.8 volts is needed to turn the device on.

Second, since there is no charge available in an intrinsic material, one must bias the metal gate to shift the energy levels to obtain and confine the 2DEG and the 2DHG (two-dimensional hole gas). The most desirable arrangement for complementary devices is to not only have an adjustable threshold voltage $V_t$, but also to have the device produce a large enough current flow at room temperature (300° K.) with a gate voltage at 0.2 or 0.3 volts. At 300° K. the HIGFET output current is so negligible one cannot measure the I-V characteristics of an n- or p-channel HIGFET, so the device must be cooled, typically down to 77° K., to be usable. Even at 77° K., when the gate voltage $V_g$ is zero, there is no current flowing for the n-HIGFET; an undesirable 2 volt positive $V_g$ must be applied to receive a 5 mA drain current. With the p-HIGFET, when $V_g$ is zero there is no current flowing either; an undesirable negative 1.8 volts $V_g$ is necessary to obtain approximately a 1.2 mA drain current.

Additionally, the threshold voltage of n- and p-HIGFETs is non-uniform due to large subthreshold current leakage. Furthermore, the $I_{ds}$-$V_{ds}$ curve of the p-HIGFET becomes quite distorted at low drain-to-source voltages due to the large contact resistances.

SUMMARY OF THE INVENTION

In view of the above problems associated with the related art, it is an object of the present invention to provide an apparatus and a method for easily fabricating a complementary p-MODFET and n-MODFET on the same wafer. Other objects of the present invention include providing such a complementary transistor device with a precise control of threshold voltage, low gate voltage, high switching speed, low power consumption and higher IC level integration.

These objects are accomplished in a preferred embodiment by fabricating a p-MODFET integrated with an n-MODFET on the same wafer. The fabrication begins with an n-channel $Al_xGa_{1-x}As$-GaAs selectively doped heterojunction transistor consisting of an undoped GaAs buffer layer on a semi-insulating GaAs substrate, an $Al_xGa_{1-x}As$ spacer layer on the buffer layer, an n-$Al_xGa_{1-x}As$ layer on the spacer layer and a surface passivating GaAs cap layer on top. A section of the n-channel SDHT is then transformed to a p-channel SDHT by p-type ion implantation at a selected location on the above layers. After annealing, a gap is formed down through the various layers into the buffer layer to isolate the n-SDHT from the p-SDHT. Gate windows are formed through the cap, and drain, source and gate contacts are then made by standard IC fabrication techniques.

It should be kept in mind that although only an $Al_xGa_{1-x}As$ heterojunction will be discussed herein as the most desirable and feasible type of device, with other semiconductor materials such as InGaAs, $Al_xGa_{1-x}As$ and Si compounds can also be used.

Both the p-MODFET and the n-MODFET can thus be simply fabricated on the same wafer. Except for the ohmic steps, most of the processing steps are identical for both the p- and n-channel integrated devices. Also, the present invention has an increased switching speed due to increased electron and hole mobility; this results from the carriers traveling in the small band gap intrinsic layer at the heterojunction interface.

These and other features and advantages of the invention will be apparent to those skilled in the art from the following detailed description of a preferred embodiment, taken together with the accompanying drawings, in which:

DESCRIPTION OF THE DRAWINGS

FIGS. 3(a)-(f) are successive sectional views of the fabrication process for the preferred embodiment of the present invention.

DETAILED DESCRIPTION OF A PREFERRED EMBODIMENT

Figure 1:
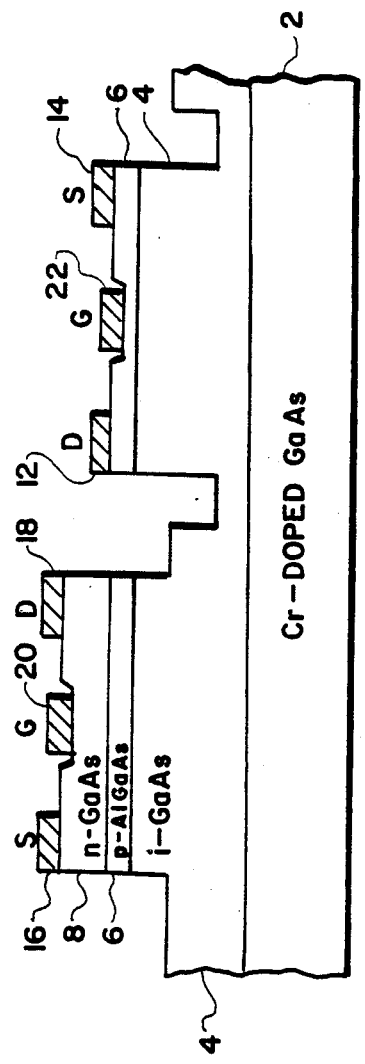
FIG. 1 is a sectional view of a prior art n-channel HB MESFET/p-channel MODFET device.
Figure 2:
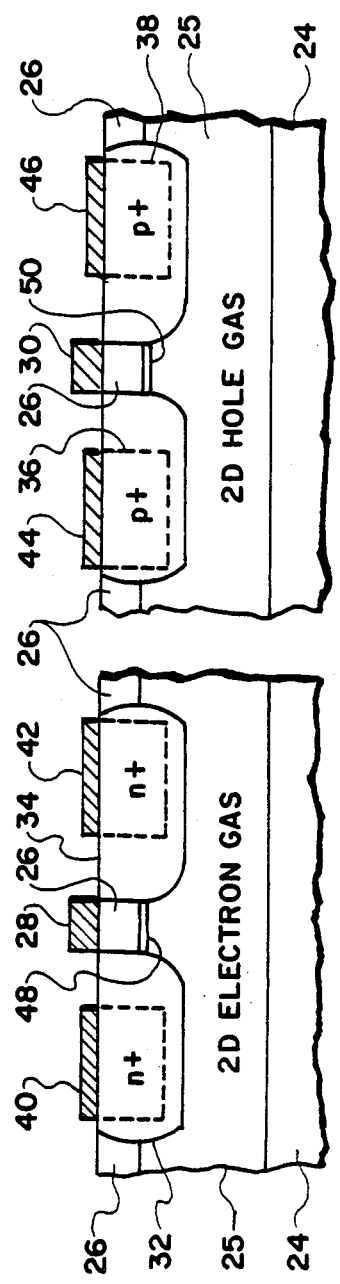
FIG. 2 is a sectional view of a prior art p- and n-HIGFET device.

The present invention begins with a partially completed, standard n-channel $Al_xGa_{1-x}GaAs$ modulation doped field effect transistor (MODFET), and employs an ion implantation to convert a portion of the starting n-type MODFET into a p-type MODFET. A typical n-channel AlGaAs/GaAs MODFET structure is shown in FIG. 3(a). An undoped intrinsic GaAs buffer layer 54 is epitaxially grown onto a conventional GaAs semi-insulating substrate 52. The following successive layers are epitaxially grown onto buffer layer 54: an $Al_xGa_{1-x}As$ spacer layer 56, an n-$Al_xGa_{1-x}As$ semiconductor layer 58, and n-GaAs cap layer 60. As is typical of an n-MODFET, 2DEG 62 is confined at the GaAs-$Al_xGa_{1-x}As$ interface, in the undoped intrinsic GaAs buffer layer 54. The 2DEG electron mobilities of this starting wafer were 4,000 $cm^2$/V-s and 67,800 $cm^2$/V-s, with sheet electron densities of $3.62 \times 10^{11}/cm^2$ and $5.92 \times 10^{11}/cm^2$ at temperatures of 300° K. and 77° K., respectively. The $Al_xGa_{1-x}As$ layer has an AlAs composition (x) of 45%.

In the preferred embodiment of the invention, a resistive mask 64 is applied to the AlGaAs/GaAs MODFET structure as shown in FIG. 3(b). A selected location on the MODFET is irradiated with a suitable dopant such as Be+ ions 66 to achieve a p-ion implantation region 67, enclosed by dashed outline 68. The preferred implantation dosage of Be+ ions 66 is $8 \times 10^{13}/cm^2$.

FIG. 3(c) shows the composition of the device resulting from the ion implantation. The implanted portion of n-GaAs cap layer 60 is transformed into a p-GaAs cap layer 70. Similarly, the implanted section of $Al_xGa_{1-x}As$ semiconductor layer 58 becomes the p-$Al_xGa_{1-x}As$ semiconductor layer 72. At this point in the fabrication, the whole device is exposed to a furnace anneal of 700° C. for approximately 20 minutes, followed by a rapid thermal anneal of 800° C. for approximately 30 seconds, to repair ion implantation damage and to activate the Be+ dopants. Before the furnace anneal, a thin nitride $Si_3N_4$ was deposited on the GaAs to preserve the surface during anneal. The direct result of dopant activation is that a 2DHG 74 is formed and confined at the GaAs/$Al_xGa_{1-x}As$ interface.

As shown in FIG. 3(d), the resistive mask 64 is then removed. The next step in the fabrication process is the etching of an isolation gap 76 between the p- and n-regions. Preferably, the gap is not wider than about five to ten microns, and extends through the GaAs cap layer 60, 70, the $Al_xGa_{1-x}As$ semiconductor layer 58, 72, and the $Al_xGa_{1-x}As$ spacer layer 56 into the undoped intrinsic GaAs buffer layer 54. The isolation gap can also be achieved with ion implantation of oxygen ions or protons.

After the etching of isolation gap 76, gate windows 79 and 83 are etched in the GaAs cap layer 60, 70 to expose respective portions of the underlying n- and p-doped $Al_xGa_{1-x}As$ semiconductor layers 58, 72, as shown in FIG. 3(e). This process is accomplished using a selective etch, which etches away GaAs but leaves $Al_xGa_{1-x}As$. The remaining cap layer sections 78, 80, 82, 84 on either side of the windows provide support for source and drain contacts. The next step in the fabrication process is the deposition of ohmic contacts. FIG. 3(f) shows a p-channel source ohmic contact 86 and drain ohmic contact 88 in place over cap sections 78 and 80, respectively. These contacts are typically composed of AuBe-based compounds. Similar n-channel source and drain ohmic contacts 90 and 92 are deposited over cap sections 82 and 84, respectively, and are typically composed of AuGe based compounds.

Finally, metal gate contacts 94, 96 are deposited within the etched windows 79, 83, respectively, in direct contact with the $Al_xGa_{1-x}As$ semiconductor layer 58, 72. Except for the difference in the ohmic contact material which requires the ohmic contact deposit to be performed in separate steps, most of the fabrication steps are identical for both the p- and n-MODFETs. Thus, much of the processing can be done in a single pass, which greatly simplifies fabrication of these devices.

As depicted in FIG. 3(f), the completed device contains a p-MODFET to the left of isolation gap 76, integrated with an n-MODFET to the right of the gap on the same wafer substrate. The threshold voltage of the n-channel side is precisely determined by the original layer thickness of n-AlGaAs semiconductor layer 60 and AlGaAs spacer layer 56, while the threshold voltage of the p-channel side is determined by the dosage and depth of the implanted p-type ions (Be+).

Fabricated in this fashion, the p- and n-channel MODFETs not only have adjustable voltage thresholds by design, but also operate effectively at room temperature. For example, at 300° K. with zero gate voltage, approximately 0.5 mA flows in the p-MODFET; a large current flow occurs when $V_g$ is zero in the n-MODFET.

Although the fabrication of a single pair of MODFETs on the one wafer has been discussed, in practice many such pairs may be fabricated on the same wafer.

While a specific embodiment of the invention has been shown and described, various modifications and alternate embodiments will occur to those skilled in the art. Accordingly, it is intended that the invention be limited only in terms of the appended claims.

We claim:

1. An integrated circuit fabrication method for forming complementary field effect transistors on the same wafer substrate, comprising:
    epitaxially growing an intrinsic semiconductor buffer layer on a semiconductor substrate layer;
    epitaxially growing a semiconductor spacer layer on the buffer layer, said spacer layer being of different chemical composition and with a larger bandgap than said buffer layer;
    forming on said spacer layer an n-type doped semiconductor layer composed of the same material as said spacer layer;
    forming on said n-type doped layer a surface passivating n-type doped semiconductor cap layer composed of the same material as said buffer layer;
    implanting sufficient p-type ions into a selected portion of the n-type doped layer to transform said portion into a p-type layer;
    forming a pair of windows through the cap layer to expose portions of the n-type and p-type doped layers, respectively;
    forming a gap through the cap, semiconductor and the spacer layer and into the buffer layer to isolate the p-doped region from the n-doped region; and
    depositing respective source and drain contacts on the cap layer on opposite sides of each of said windows, and gate contacts on the underlying doped layers within said windows.

2. The method of claim 1, wherein the p-type dopant comprises beryllium.

3. The method of claim 1, wherein said gap is no more than about ten microns wide.

4. The method of claim 3, further comprising the step of confining a two-dimensional electron gas (2DEG) at the non-implanted portions of the interface between the buffer and the spacer layer.

5. The method of claim 4, further comprising the step of confining a two-dimensional hole gas (2DHG) at the implanted portions of the interface between the buffer and the spacer layer.

6. The method of claim 5, wherein said 2DHG is formed by implanting sufficient p-type ions into a selected doped area of the 2DEG to transform said area into a 2DHG channel.

* * * * *